US011295826B1

United States Patent
Perez Chamorro et al.

(10) Patent No.: US 11,295,826 B1
(45) Date of Patent: Apr. 5, 2022

(54) OTP CONTROL LOGIC WITH RANDOMIZATION FOR SENSING AND WRITING FUSE VALUES

(71) Applicant: NXP B.V., Eindhoven (NL)

(72) Inventors: Jorge Ernesto Perez Chamorro, Bussigny (CH); Michael Elsasser, Austin, TX (US)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 17/218,072

(22) Filed: Mar. 30, 2021

(51) Int. Cl.
  *G11C 17/00* (2006.01)
  *G11C 17/18* (2006.01)
  *G11C 17/16* (2006.01)

(52) U.S. Cl.
  CPC .............. *G11C 17/18* (2013.01); *G11C 17/16* (2013.01)

(58) Field of Classification Search
  CPC ................................ G11C 17/18; G11C 17/16
  USPC ........................................................ 365/96
  See application file for complete search history.

(56) References Cited

U.S. PATENT DOCUMENTS

| 9,922,720 B2 | 3/2018 | Sandri et al. |
| 2018/0197621 A1* | 7/2018 | Jeong .................. G11C 29/027 |
| 2019/0042118 A1 | 2/2019 | Lu et al. |
| 2020/0327951 A1* | 10/2020 | Jung ..................... G11C 29/38 |

* cited by examiner

*Primary Examiner* — Huan Hoang

(57) ABSTRACT

A method and apparatus are described for OTP control logic with randomization for sensing and writing fuse values. In an embodiment, OTP control logic has an address counter to determine an address of a fuse to be read from an OTP fuse box and a corresponding address of a shadow register, a fuse box addressing circuit to read a fuse value from a fuse of the fuse box, a clock circuit coupled to the address counter to provide a clock signal to the address counter, and a randomization circuit to interrupt the clock signal at random times to prevent the address counter from determining a next address in response to the clock signal.

20 Claims, 3 Drawing Sheets

OTP CONTROL LOGIC WITH RANDOMIZATION FOR SENSING AND WRITING FUSE VALUES

BACKGROUND

Silicon manufacturers rely on One-Time Programmable (OTP) fuse boxes as non-volatile storage for a wide variety of different software or parameter-driven integrated circuits including microprocessor (MPU), microcontroller (MCU), and field programmable gate array (FPGA) products. Fuse boxes are often used to store initial boot sequences, startup code, root of trust secrets, and other sensitive or secret information.

An OTP fuse box has multiple fusible circuits, typically, but not necessarily, arranged in addressable rows and columns. The fuses or anti-fuses are programmed one time by, for example, applying a higher voltage or current to a particular fuse or anti-fuse which permanently opens or closes the fusible circuit. The value or values at the address of the programmed circuit is constant and permanent after the programming is completed. At an appropriate time, all or part of the values programmed into the fuses of the fuse box are sensed and then written to shadow registers, which are an accessible, fast memory, for example flip-flop registers, or a static random-access memory (SRAM), for use by the integrated circuit.

OTP control logic senses the fuse values and writes the fuse values into the accessible memory. By the very nature of the fuse box and its commonalities across different technologies, the control logic that is expected to be part of an OTP controller is fairly predictable and common to many different devices. In order to access the fuse box, an OTP controller typically uses a set of processes that are independent of the underlying system in which it is deployed, whether that is a single die, a system on a chip (SoC), a system in a package (SiP), or another underlying system.

Attackers with access to a system and low-cost equipment, may use a basic understanding of the processes of an OTP controller to disrupt fuse sensing, to disrupt writing into accessible memory, or to detect or infer the secrets stored in those fuses. One type of attack is referred to generally as fault injection, which modifies what the OTP control logic reads from the fuses or writes to the shadow registers. Another type of attack is generally referred to as side channel leakage, which extracts what the OTP control logic reads from the fuses by detecting electromagnetic field emissions or power fluctuations. In many cases these attacks may be conducted with access only to the system's electromagnetic field or power environment. These attacks may be performed without altering the contents of the fuse box and without access to the process of programming the fusible elements of the fuse box.

SUMMARY

A method and apparatus are described for OTP control logic with randomization for sensing and writing fuse values. In an embodiment, OTP control logic has an address counter to determine an address of a fuse to be read from an OTP fuse box to obtain a sensed value and a corresponding address of a shadow register to write the sensed value, a fuse box addressing circuit to read a fuse value from a fuse of the fuse box corresponding to the address determined by the address counter, a clock circuit coupled to the address counter to provide a clock signal to the address counter configured to drive the address counter to determine a next address in response to the clock signal, and a randomization circuit to interrupt the clock signal at random times to prevent the address counter from determining a next address in response to the clock signal.

In some embodiments, the randomization circuit comprises gating logic between the clock circuit and the address counter to block the clock signal. In some embodiments, the randomization circuit comprises a logic gate having the clock signal as an input and a random number generator as an input. In some embodiments, the random number generator comprises a limit circuit configured to limit a number of random numbers provided to the gating logic as an input. In some embodiments, the limit circuit comprises an n-bit counter having a threshold register to limit a total number of random numbers in a fuse box read cycle.

Some embodiments include a start delay circuit coupled to the address counter to generate a start signal to the address counter to delay the start of the address counter by a random number of clock cycles. In some embodiments, the start delay circuit comprises a random number generator coupled to a delay counter to receive a sequence of numbers from the random number generator, the delay counter generating the start signal after counting a predefined number of numbers from the random number generator. In some embodiments, the start delay circuit comprises an m-bit counter having a random m-bit number and a counter to count clock cycles until the m-bit number is reached and to generate the start signal in response thereto.

Some embodiments include an address transformation circuit coupled to the address counter configured to receive the address determined by the address counter, transform the received address to a different address, and provide the transformed address to the fuse box addressing circuit. Some embodiments include a shadow register writing circuit also coupled to the address transformation circuit and configured to receive a corresponding address of a shadow register from the address transformation circuit to write the sensed value to the corresponding address.

In some embodiments, the address transformation circuit further comprises a random seed input to receive a random seed and wherein the address transformation circuit transforms the received address in response to the random seed. In some embodiments, the fuse box is divided into address blocks and wherein the address counter counts through all addresses of one block before counting through addresses of another block. In some embodiments, the randomization circuit comprises a linear feedback shift register configured to generate a number to determine whether to interrupt the clock signal.

In an embodiment, One-time Programmable (OTP) control logic includes an address counter to determine an address of a fuse to be read from an OTP fuse box to obtain a sensed value and a corresponding address of a shadow register to write the sensed value, a fuse box addressing circuit to read a fuse value from a fuse of the fuse box corresponding to the address determined by the address counter, a clock circuit coupled to the address counter to provide a clock signal to the address counter configured to drive the address counter to determine a next address in response to the clock signal, and an address transformation circuit coupled to the address counter configured to receive the address determined by the address counter, transform the received address to a different address, and provide the transformed address to the fuse box addressing circuit.

In an embodiment, embedding an indication of the fault status into a bit stream at the physical layer includes embedding an operations, administration, and management (OAM) word into the bit stream to communicate the indication of the fault status.

Some embodiments include a shadow register writing circuit also coupled to the address transformation circuit and configured to receive a corresponding address of a shadow register from the address transformation circuit to write the sensed value to the corresponding address.

In some embodiments, the address transformation circuit further comprises a random seed input to receive a random seed and wherein the address transformation circuit transforms the received address in response to the random seed. In some embodiments, the fuse box is divided into address blocks and wherein the address counter counts through all addresses of one address block before counting through addresses of another address block.

Some embodiments pertain to a method that includes providing a clock signal to an address counter to drive the address counter to determine a next address in response to the clock signal, interrupting the clock signal at random times to prevent the address counter from determining a next address in response to the clock signal, reading a sensed value from a one-time programmable (OTP) fuse of a fuse box corresponding to the address determined by the address counter, and writing the sensed value into a corresponding address of a shadow register.

Some embodiments include limiting the number of random times of interrupting the clock signal. In some embodiments, determining an address comprises receiving an address from an address counter, transforming the received address to a different address using a random key and providing the transformed address as the address determined by the address counter.

BRIEF DESCRIPTION OF THE DRAWINGS

A more complete understanding of the subject matter may be derived by referring to the detailed description and claims when considered in conjunction with the following figures.

DETAILED DESCRIPTION

Figure 1:
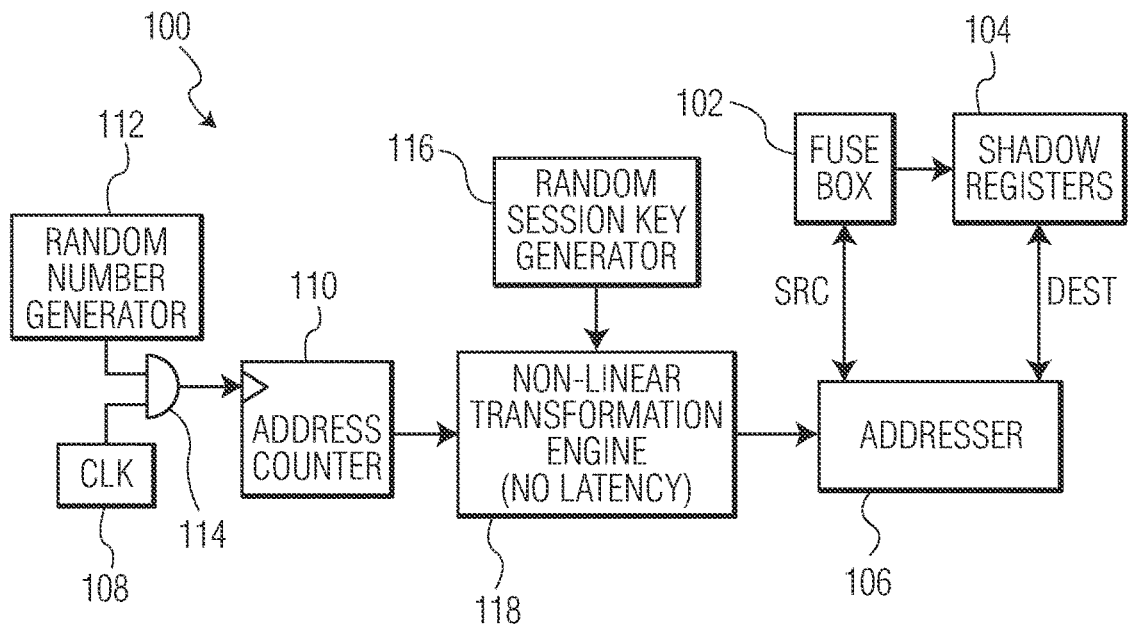
FIG. 1 is a block diagram of OTP control logic to sense fuse values and write to shadow registers with timing and address randomization.

It will be readily understood that the components of the embodiments as generally described herein and illustrated in the appended FIGS. could be arranged and designed in a wide variety of different configurations. Thus, the following more detailed description of various embodiments, as represented in the drawing figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in some embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

OTP control logic determines the sequence in which the fuses of a fuse box are sensed, senses those fuse values, determines the sequence in which the sensed values are written into shadow registers, and writes the sensed values into the shadow registers. Depending on the underlying system, the shadow registers may be the final destination from which the values are used or another process may access the shadow registers to write the values into other locations. In many systems, the OTP control logic is designed for simplicity and speed because its operation is required for the initial startup of the system. As described herein the process of the OTP control logic may be randomized in two axes: time and order. This randomization effectively frustrates fault injection and side channel leakage attacks.

An OTP controller may be understood as including the OTP control logic and the OTP control logic may be understood as including a sequencer, which may be implemented as a finite state machine (FSM) or another simple logic device. The sequencer is the part of the OTP control that determines the sequence in which the fuses of a fuse box are sensed and in which the sensed values are written into shadow registers. A sequencer FSM provides simplicity and speed and an additional randomization process may be added to it as described herein. However, the same two axes of randomization may be implemented using much more complex systems.

In the present application, random, randomization, and other forms of the word random are used to refer to a pattern or output that lacks or seems to lack a regular timing or pattern. This may include a pseudorandom pattern and a regular pattern that seems to lack a regular timing or pattern over a short interval as contemplated here. While security may be maximized with a true, mathematically random pattern, this is not required to gain significant benefits as described herein.

A fault injection attack does not require modification of the fuse box contents. The fuse values that are written into the shadow registers are propagated through multiple copies over the OTP controller and the fabric. In many implementations, at least some of the shadow registers are hardware visible and written over a volatile supporting structure. In some implementations, at least some of the shadow registers are not hardware visible, but the contents are copied by software into hardware visible registers, SRAM (Static Random-Access Memory) or another fast, accessible location for use. When the copy process is ordered in time and through a logical address pattern, the process is predictable. An attacker leverages the predictability of the process by fault injection techniques such as glitch injection through the power supply. A power supply glitch alters the integrity of an affected portion of the copied contents by affecting the written value or the written location. This in turn gives the possibility to the attacker to modify secrets or security sensitive configurations, or to remove locks or restrictions. The modifications are effective only for the affected session but have been enough to allow an attacker to extract secrets via logical interfaces, or to perform permanent modifications to the affected system.

Side-channel leakage allows a patient attacker to generate a copy of fuse contents as it is written into shadow registers by observing power consumption either globally or locally. Even with only partial information, the remaining contents may sometimes be inferred or guessed. In some circumstances, critical information about the secret is inferred such as its Hamming weight (i.e., the number of bits set to 1). In many fuse box implementations, the secrets are stored in the fuse box without encryption. The contents are instead secured physically by the nature of the fuses and the limited access paths through the OTP controller. The plain contents of the secrets are transferred from the fuse box into the shadow registers as chunks with a size determined by the data path of the fuse box. This may be much smaller than the actual size of the secret (e.g., an AES key may be 256 bits but the transfer may be done in chunks of 16 bits or 32 bits). The smaller chunks have a smaller set of possible electrical signatures allowing the secret to be more easily inferred The two-axis randomization described herein overcomes both side-channel and fault-injection attacks. This adds considerable protection to the underlying system without any significant impact in latency, circuit area, and complexity. Table 1 shows a predictable read and load or write operation from fuses 0 to n of a fuse box to shadow registers 0 to n. As shown, the first fuse is read first and then written into the first shadow register. After that, the second fuse is read second and then written into the second shadow register. This continues until the nth fuse which is written into shadow register n at a sequence n in the ordering. In some embodiments, the fuses are grouped into blocks. The blocks may be read in various orders, but the order within each block is sequentially ordered in the manner suggested by Table 1.

TABLE 1

| Default Loading | | |
| --- | --- | --- |
| Sequence Order | Sensed Fuse | Write Location |
| 0 | 0 | 0 |
| 1 | 1 | 1 |
| 2 | 2 | 2 |
| 3 | 3 | 3 |
| 4 | 4 | 4 |
| ... | ... | ... |
| n | n | n |

Table 2 shows an example of a more secure loading with variation in order and time. The order of the address numbers as well as the position of the waiting times (e.g., position 2) may be chosen at random before every loading request. By changing the address order and time offset for each loading request, the process loses its predictability. Fault injection is made unreliable and side channel attacks are made several orders of magnitude harder due to the unpredictability of the process. In other words, an attacker cannot know which bit is being disrupted or captured except by guessing how the randomization is performed. The sequence order may be randomized using wait cycle, dummy cycles, no operand cycles, jitter, or in another suitable way. The address order and time offset may also be changed each time the cycle repeats by further randomization.

TABLE 2

| Randomized Loading | | |
| --- | --- | --- |
| Sequence Order | Sensed Fuse | Write Location |
| 0 | 17 | 17 |
| 1 | 41 | 41 |
| 2 | wait (no operation) | wait (no operation) |
| 3 | 3 | 3 |
| 4 | n | n |
| ... | ... | ... |
| n | 0 | 0 |

FIG. 1 is a block diagram of OTP control logic 100, such as may be included in an OTP controller for safety fuse loading. The OTP control logic may be for use in any of a variety of different electronic systems. There may be more components (not shown) to suit a particular implementation. A fuse box 102 contains an array of fuses that store values that have been written into the fuses of the box. The fuse box is 102 is coupled to shadow registers 104 to which sensed values from the fuse box are to be written. The fuse box values are sensed in a sequence by an addresser 106. The addresser also controls the loading of the sensed values from the fuses of the fuse box 102 into the shadow registers 104. The addresser 106 is driven by a clock circuit 108 which is coupled to an address counter 110. The clock circuit 108 may be within an OTP controller or receive a clock from an external source such as a reference oscillator. The address counter 110 determines the next address to be accessed by the addresser 106. In some embodiments, the address counter starts at address 0 at the first clock and then increments the address by 1 in response to each subsequent clock. The counter returns to 0 after reaching its maximum value. A reset input (not shown) applied by the OTP controller may be used to start the address count at 0. The addresser then responds to the address counter 110 by sensing a value of a fuse at the given address from the address counter 110 and then loading that sensed value into the corresponding shadow register 104. In some embodiments, the addresser is implemented as a finite state machine (FSM) to read and write to the corresponding registers as the addresses are received from the address counter. Such a simple and fast implementation helps to ensure reliability, although it may be more vulnerable to the attacks mentioned above.

In order to introduce some randomization in time to the system, a random number generator 112 is optionally coupled to a gate 114, such as a logic AND gate. Any of a variety of different random number or pseudorandom number generators may be used. A simple example of a suitable random number generator is a binary entropy circuit that generates either a 0 or 1 output. The clock circuit 108 is also optionally coupled to the gate 114. Each clock signal from the clock circuit, such as a 1 is applied to the gate. If the random number generator 112 also produces a 1, then there is a clock pulse at the gate output. If the random number generator 112 produces a 0, then there is no clock pulse at the gate output, so that the clock is suppressed. When there is no clock signal, such as a 0, then there is no clock pulse at the gate output. The output of the gate 114 provides a clock signal to the address counter 110. In response to the clock signal, the address counter changes the address that it provides as an output to the addresser 106, typically by incrementing the address in response to each clock. By injecting a random number from the random number generator 112 to the gate 114, the clock circuit 108 may be interrupted at random times. This causes the address counter 110 to skip clocked intervals. The address counter output will not be incremented with a regular timing but with random delays.

The address counter 110 is also optionally coupled to a nonlinear transformation engine 118 although any of a variety of other components, including a linear transformation engine may be used. The nonlinear transformation engine is between the address counter 110 and the addresser 106. In this example, the nonlinear transformation is provided a random session key by a random session key generator 116. The effect of the random session key generator 116 is to modify addresses from the address counter 110 before the address is provided to the addresser 106. The modified addresses are changed from the original linear sequence to a different random sequence or alternative nonsequential order. The nonlinear transformation engine may operate using bijection or a bijective function to convert from the address counter value to a different value using the session key. Substitution boxes (S-Box) may be used to apply the session key to the address counter value. Alternatively, a simple XOR or other logic function may be used. These operations may all be performed in real-time at the same rate as the rate that input values are received from the address counter in order to reduce latency.

Figure 2:
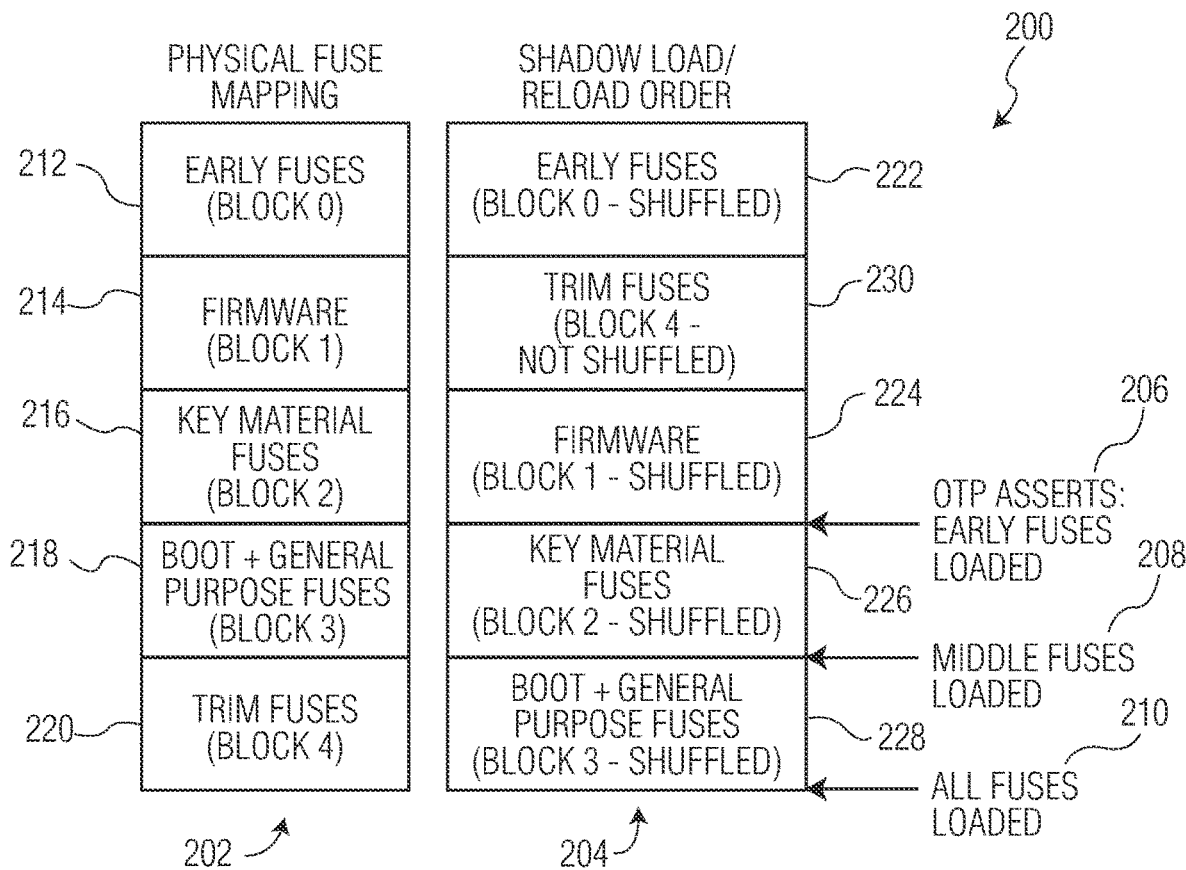
FIG. 2 is a diagram of an example memory map for a fuse box and corresponding shadow registers.

FIG. 2 is a diagram of an example of a fuse box memory map 202 and a corresponding loaded shadow register memory map 204 in the order that they are loaded. In this example, the physical fuse mapping of the trim fuses block 220 is located at the end of the fuse map. The fuse map starts with an early fuses block 212 (block 0), followed by a firmware block 214 (block 1), followed by a key material fuses block 216 (block 2), followed by a boot and general-purpose block 218 (block 3). The last block is the trim fuses block 220 (block 4). This order represents an order of addressing when each fuse is read in sequential order as provided by the address counter. The order of the fuses may be determined based on many different criteria. In some embodiments, the trim fuses block 220 may have different numbers of values, depending on a particular SRAM design. By putting this block at the end, the variable size does not disrupt the addresses of the other blocks that do not change.

The OTP control logic as described herein allows blocks to be loaded into the shadow register memory map 204 in different orders from how they are ordered in the fuse map. In the example shadow register memory map 204, the first block is the early fuses block 222 as in the physical fuse box memory map 202. However, the order of values within the block is shuffled compared to the original order. The second block is the trim fuses block 230 which was placed last in the physical fuse box memory map 202. The remaining blocks, firmware block 224, key material fuses block 226 and boot and general-purpose fuses block 228 are loaded in the order that they occur in the physical fuse mapping. However, any block may be loaded in any order. By loading the trim fuses block 230 out-of-order with respect to the physical location, the trim fuses block 230 of the shadow registers is available sooner to perform processes related to the trim fuses block 230 and thereby to speed startup times.

The OTP controller in this example generates status signals to start corresponding sequential startup phases. An Early Fuses Loaded signal 206 from the OTP controller may be used to initiate a first set of startup processes. A later Middle Fuses Loaded signal 208 may be used to initiate a second set of startup processes. Finally, an All Fuses Loaded signal 210 may be used to initiate the remaining startup process. As an example, the trim fuses may be used to perform SRAM (Static Random-Access Memory) repair before the next set of startup processes is initiated. The particular blocks and the particular status signals are provided as examples. Different systems may have different blocks with different sizes in different orders and different status signals to suit particular applications.

As shown in FIG. 1, a simple way to implement randomization in time is by using a gate 114, such as a logic gate, to randomly gate the clock circuit 108 output to the address counter 110 of the OTP controller. However, a uniformly distributed random gate function would interrupt the clock signal about one half of the time. On average, half of the time the clock signal would be enabled and the other half of the clock signals would be disabled. This would double the time of the overall loading process. In some cases, this delay may not be desired so that a more complex system may be used that does not add more than a given number of randomly inserted wait times.

Figure 3:
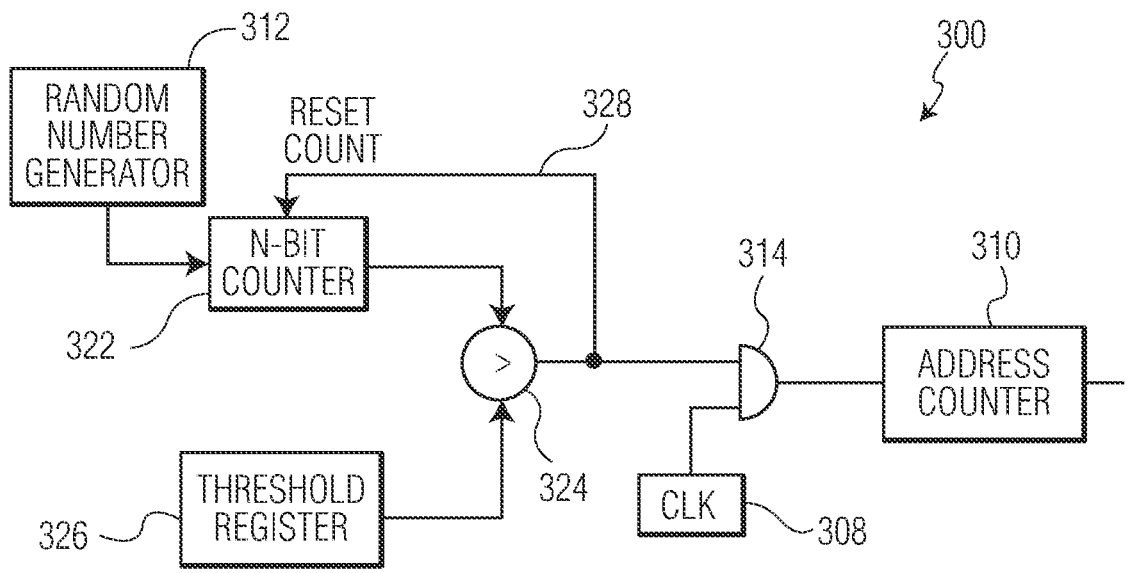
FIG. 3 is block diagram of a portion of OTP control logic for randomizing the timing of an address counter.

FIG. 3 is a block diagram of an alternative circuit configuration of a portion of OTP control logic for randomizing the clock input using an additional counter. In this embodiment, a clock circuit 308 is coupled to an address counter 310 through a logic gate 314, such as an AND circuit. The address counter 310 increments the address after receiving each clock signal from the logic gate 314. The address counter is coupled to an addresser and other components (not shown). The logic gate 314 allows the clock signal from the clock circuit 308 to be applied to the address counter 310 only upon receiving a bit or pulse from a random number generator 312. In one example, the clock signal is a positive signal and is passed through the logic gate whenever the random number generator 312 generates a digital 1 signal. The particular nature and values of the clock, the random number, and the logic gate may be modified as appropriate to suit different address counter inputs and other system configuration variations.

In contrast to the example of FIG. 1, in this example, an n-bit counter 322 and a threshold gate 324 are placed between the random number generator 312 and the logic gate 314. The random number generator 312 may be configured to generate bits with an approximately 50% duty cycle for the results of 1 and 0. Each 1 bit is applied to the n-bit counter 322. The n-bit counter increments its output each time that it receives a digital 1 from the random number generator. When the n-bit counter output reaches a threshold value as stored in a threshold register 326, then the threshold gate passes a digital 0 bit to the logic gate 314, interrupting the clock signal to the address counter.

If the counter is set to e.g., 10, then only every 10th interrupt will be applied to the logic gate 314. The number of 0's from the random number generator is reduced by a factor of 10, reducing also the number of clock signals that are suppressed at the logic gate. A reset line 328 allows the n-bit counter to be reset. In some embodiments, the reset line is activated upon every 0 output from the n-bit counter 322. In this way the threshold may be set to any value by setting a new value in the threshold register 326 without changing the configuration of the n-bit counter 322. In the example of 10, after the n-bit counter 322 counts to 10 and delivers a digital 0 output, the output is detected at the reset line 328 and applied to the n-bit counter 322 to reset the count from the beginning. While the n-bit counter is described as counting binary 0's and outputting a binary 1, the polarity of any of the signals may be changed to suit the threshold register 326, the logic gate 314 and any other aspects of the circuit design.

In another example, the circuit of FIG. 3 is used to load 512 words from the fuses of a fuse box into the shadow copies of a shadow register. Consider that the impact of the time randomization to the shadow loading time is to be limited to approximately 6%. To meet the 6% criterion, the n-bit counter 322 may be implemented as a 7-bit counter (i.e., n=7) and the predefined threshold register 326 may be set to 8. In this case, the threshold would be reached at the threshold gate 324 on average every 8*2=16 loads, making a probable occurrence of 512/16=32 wait times, or 6.25%.

The example circuit of FIG. 3 provides time randomization by causing the clock signal to the address counter to be blocked at unpredictable clock times. The address counter does not increment the count at some clocks so that an attacker cannot predict an address simply by the timing of a write command. Another aspect of time randomization is to inject a random delay to the start of the process. The delay may be implemented using a wait time, dummy cycles, a sequence of no operand (NOP) commands, jitter or in other ways.

Figure 4:
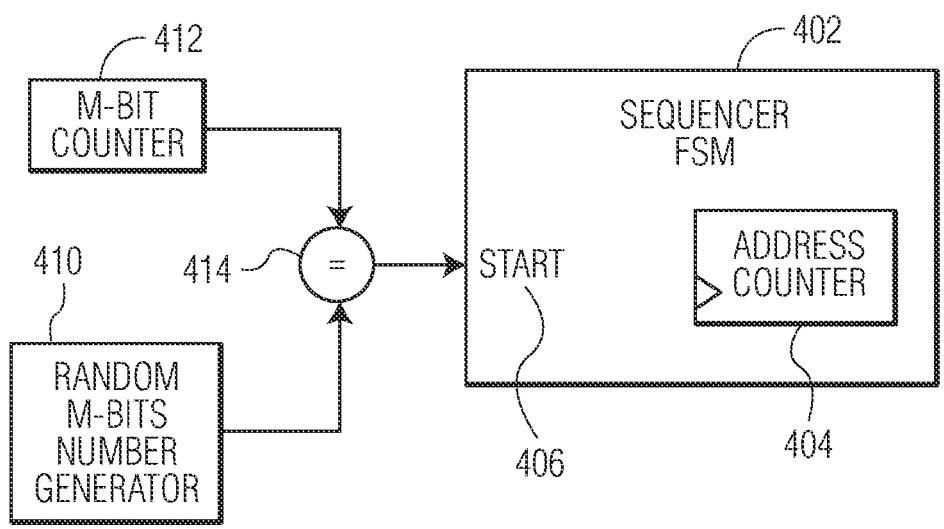
FIG. 4 is a block diagram of a portion of OTP control logic for randomizing a start time of an address counter.

FIG. 4 is a block diagram of a circuit of a portion of OTP control logic to inject a random start time delay into a sequencer FSM (Finite State Machine). The sequencer FSM 402 may be a part of or in the form of an OTP controller, the address counter 110, or an addresser 106 of FIG. 1, or any other suitable configuration for use in sensing fuse values and writing the values to shadow registers. In this example, the sequencer FSM includes an address counter 404 to provide addresses to an addresser (not shown) as well as other components (not shown). The sequencer FSM starts the fuse value loading upon receiving a start signal at a start input port 406. The start signal may be generated by hardware associated with the startup process, for example.

In this example an unpredictable delay is applied to the application of the start signal. A random number generator 410 that generates a random number with m bits is applied to a matching circuit 414. An m-bit counter 412 is also applied to the same matching circuit 414 and the matching circuit 414 output is coupled to the start input port 406. To start the sequencer FSM, an m-bit random number is drawn at the generator 410 and the m-bit counter 412 is triggered. When the two numbers match, the sequencer FSM 402 starts the fuse sensing structure and process including the address counter 404. This circuit adds an additional random delay between the moment that the circuit is powered-on and the actual clock cycle when the loading process starts. Such randomization, besides delaying the start process, increases exponentially the synchronization difficulty of potential attacks. The circuit of FIG. 4 is provided as one example for generating a start time delay and many other circuit configurations may be used instead.

As described above, the process of the sequencer may be randomized in two axes: time and order. The first axis of randomization makes the occurrence of a load a non-deterministic event. The second axis of randomization causes the address of the source and destination to be non-deterministic. The first axis may be used without the second axis and the second axis may be used without the first axis. The first axis may include both the first aspect of unpredictable clocking and the second aspect of unpredictable start time or just one of these two aspects.

The second axis of randomization may be implemented by a nonlinear transformation engine 118 as described in the context of FIG. 1. In that example, the address order is randomized by means of a nonlinear function that keys in a random seed. To further enhance security, in some embodiments, the random seed may be changed before every loading process. This changes the loading order for each block of addresses.

A variety of different functions including linear functions may be used to transform the order of the addresses. Even when an attacker is able to determine the time at which a set of fuses is loaded, if the addresses are loaded in a random order, the attacker still cannot identify the values. When a nonlinear function is used it is still more difficult to reverse-engineer the order in which all of the fuses are loaded.

The complexity of the transformation function may be balanced against the cost of the circuit and any delay required to compute the transformation function. For loading speed, a function that requires a single clock cycle is preferred. Many deterministic functions may be calculated in combinatorial logic in a single clock cycle, eliminating any penalties to the overall loading time. Other transformation functions may require more components and clock cycles. A Fisher-Yates function may require a state register and multiple clock cycles in order to provide the full randomized order.

Deterministic transformation functions can be dimensioned as a function of the needs for any particular system. Such dimensioning allows some granularities to be preserved in the way that fuses are loaded. For example, for very large fuse maps, the fuses may be loaded so that some fuses may be used early in the loading process before all of the fuses have been loaded. As an example, if a process requires only the contents of addresses 0-128, then that process may be initiated early in the shadow loading process. This dimensioning may be implemented by using randomization functions with different sizes to allow different randomizations within certain address space boundaries. As an example, a full address space of 1024 words may be subdivided into 16 address subspaces of 64 words each, into two 64-word subspaces, one 128-word subspace, one 256-word subspace and one 512-word subspace, or into another set of subspaces of the same or different sizes. The randomization functions may be applied to each subspace separately using the same or different functions. Smaller subspaces may be loaded first for speed and larger subspaces may be loaded later. In addition, the ordering of each subspace may be varied at different times to further frustrate attackers.

In some embodiments, the same randomization function may be used for some number of blocks, e.g., for n blocks. The blocks may have the same or different address space sizes. In some embodiments, on a given load process, using the same random seed as input to the randomization function, the transformed output for block (0) is different than block (1) vs block (2) vs . . . block(n). On a subsequent load process, when the random seed is the same value, then the transformed outputs are the same as for the earlier load. In some embodiments, different inputs but the same functions may be used and the same or a different random seed. The inputs in this case are the address bits. Variability may be added even when the same randomization function and seeds are used by applying the same function and seeds to different address regions.

Figure 5:
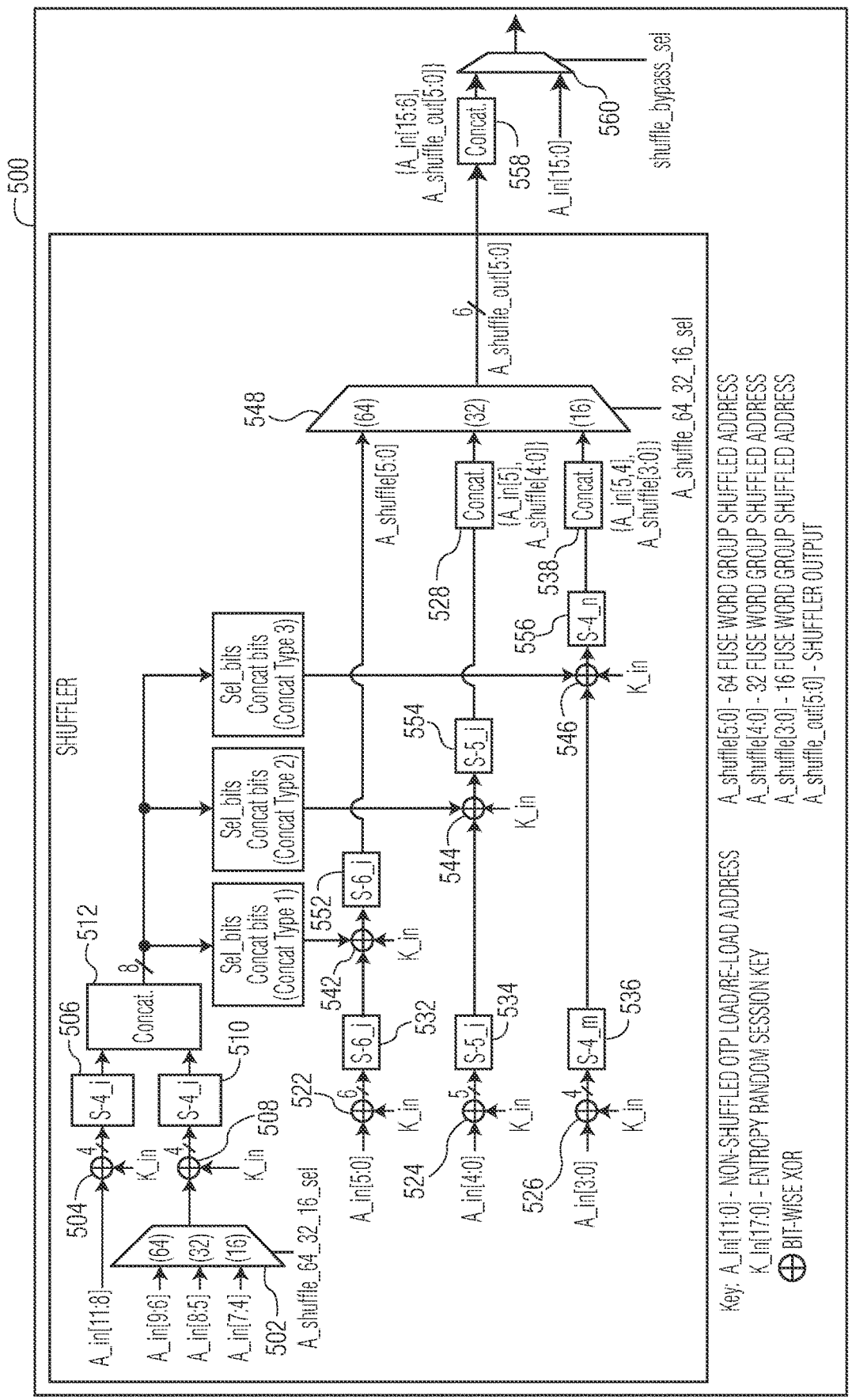
FIG. 5 is a block diagram of an address transformation engine for OTP control logic.

FIG. 5 is a block diagram of an example address transformation engine 500 suitable for use with any one or more of the configurations described above. This engine supports multiple different randomization functions and multiple different address spaces. These address spaces include 24 (16), 25 (32) and 26 (64) word blocks. The address transformation uses underlying S4/S5/S6 (from S-boxes (substitution boxes) functions and therefore the functions are not described in detail. Other functions may be used to suit different requirements and implementations.

In FIG. 5, addresses are applied from, e.g., an address counter to a selector 502. The selector 502 receives a selection input and selects one of e.g., three different input addresses [9:6], [8:5], [7:4] to provide to a combiner 508. The combiner receives the selected address and a random key, and sends this to an S-4 S-Box 510. At the same time another combiner 504 receives an address [11:8] and a random key and provides this to another S-4 S-Box 506. The outputs of the S-Boxes 506, 510 are concatenated in a concatenator 512 and then provided to each of three different address shuffling lines together with a random key through a respective combiner 542, 544, 546. Each of the three address lines receives a respective address [5:0], [4:0], [3:0] at a combiner at which the respective address is mixed with a respective random key. Each output is sent to a respective S-Box of a suitable type S-6 532, S-5 534, and S-4 536 for each address line, the outputs of which are sent to the respective combiners 542, 544, 546 to be combined with the concatenated bits. These results are then presented to a second set of S-Boxes, one for each line S-6 552, S-5 554, S-4 556.

The first address line that started with the [5:0] output of the S-6 S-Box 552 is a first input to a selector 548. The second address line that started with the [4:0] output of the S-5 S-Box 554 is a second input to the selector 548 after being concatenated at a concatenator 528. The third address line that started with the [3:0] output of the S-4 S-Box 556 is a third input to the selector 548 after being concatenated at a concatenator 538. The selector 548 selects one of the three outputs as the shuffled address output [5:0] of the transformation engine. In some embodiments, the shuffled address output is applied to another concatenator 558 before being applied to sense fuses and written to a shadow register. In some embodiments a final selector 560 may be used to select between the shuffled address from the selector 548 or the concatenator 558 and the original unshuffled address. This allows some blocks of address space to be shuffled and others not to be shuffled.

Embodiments of the present invention provide a mechanism to randomize the timing and address ordering of fuse value loading. This mechanism may be applied to a wide range of integrated circuit systems including controllers, processors, FPGAs, and complex state machines in many different configurations.

The connections as discussed herein may be any type of connection suitable to transfer signals from or to the respective nodes, units, or devices, including via intermediate devices. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Serial or parallel connections may be used that transfer bits, whole words, or portions of words.

The circuit and/or component examples may be implemented as any number of separate integrated circuits or separate devices interconnected with each other in a suitable manner. These examples may alternatively be implemented as soft or code representations of physical circuitry or of logical representations convertible into physical circuitry, such as in a hardware description language of any appropriate type.

Boundaries between the above-described operations are provided as examples. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. One-time Programmable (OTP) control logic comprising:
an address counter to determine an address of a fuse to be read from an OTP fuse box to obtain a sensed value and a corresponding address of a shadow register to write the sensed value;

a fuse box addressing circuit to read a fuse value from a fuse of the fuse box corresponding to the address determined by the address counter;

a clock circuit coupled to the address counter to provide a clock signal to the address counter configured to drive the address counter to determine a next address in response to the clock signal; and a randomization circuit to interrupt the clock signal at random times to prevent the address counter from determining a next address in response to the clock signal.

2. The OTP control logic of claim 1, wherein the randomization circuit comprises gating logic between the clock circuit and the address counter to block the clock signal.

3. The OTP control logic of claim 1, wherein the randomization circuit comprises a logic gate having the clock signal as an input and a random number generator as an input.

4. The OTP control logic of claim 3, wherein the random number generator comprises a limit circuit configured to limit a number of random numbers provided to the gating logic as an input.

5. The OTP control logic of claim 4, wherein the limit circuit comprises an n-bit counter having a threshold register to limit a total number of random numbers in a fuse box read cycle.

6. The OTP control logic of claim 1, further comprising a start delay circuit coupled to the address counter to generate a start signal to the address counter to delay the start of the address counter by a random number of clock cycles.

7. The OTP control logic of claim 6, wherein the start delay circuit comprises a random number generator coupled to a delay counter to receive a sequence of numbers from the random number generator, the delay counter generating the start signal after counting a predefined number of numbers from the random number generator.

8. The OTP control logic of claim 6, wherein the start delay circuit comprises an m-bit counter having a random m-bit number and a counter to count clock cycles until the m-bit number is reached and to generate the start signal in response thereto.

9. The OTP control logic of claim 1, further comprising an address transformation circuit coupled to the address counter configured to receive the address determined by the address counter, transform the received address to a different address, and provide the transformed address to the fuse box addressing circuit.

10. The OTP control logic of claim 9, further comprising a shadow register writing circuit also coupled to the address transformation circuit and configured to receive a corresponding address of a shadow register from the address transformation circuit to write the sensed value to the corresponding address.

11. The OTP control logic of claim 9, wherein the address transformation circuit further comprises a random seed input to receive a random seed and wherein the address transformation circuit transforms the received address in response to the random seed.

12. The OTP control logic of claim 1, wherein the fuse box is divided into address blocks and wherein the address counter counts through all addresses of one block before counting through addresses of another block.

13. The OTP control logic of claim 1, wherein the randomization circuit comprises a linear feedback shift register configured to generate a number to determine whether to interrupt the clock signal.

14. One-time Programmable (OTP) control logic comprising:

an address counter to determine an address of a fuse to be read from an OTP fuse box to obtain a sensed value and a corresponding address of a shadow register to write the sensed value;

a fuse box addressing circuit to read a fuse value from a fuse of the fuse box corresponding to the address determined by the address counter;

a clock circuit coupled to the address counter to provide a clock signal to the address counter configured to drive the address counter to determine a next address in response to the clock signal; and an address transformation circuit coupled to the address counter configured to receive the address determined by the address counter, transform the received address to a different address, and provide the transformed address to the fuse box addressing circuit.

15. The OTP control logic of claim 14, further comprising a shadow register writing circuit also coupled to the address transformation circuit and configured to receive a corresponding address of a shadow register from the address transformation circuit to write the sensed value to the corresponding address.

16. The OTP control logic of claim 14, wherein the address transformation circuit further comprises a random seed input to receive a random seed and wherein the address transformation circuit transforms the received address in response to the random seed.

17. The OTP control logic of claim 14, wherein the fuse box is divided into address blocks and wherein the address counter counts through all addresses of one address block before counting through addresses of another address block.

18. A method comprising:

providing a clock signal to an address counter to drive the address counter to determine a next address in response to the clock signal;

interrupting the clock signal at random times to prevent the address counter from determining a next address in response to the clock signal;

reading a sensed value from a one-time programmable (OTP) fuse of a fuse box corresponding to the address determined by the address counter; and writing the sensed value into a corresponding address of a shadow register.

19. The method of claim 18, further comprising limiting the number of random times of interrupting the clock signal.

20. The method of claim 18, wherein determining an address comprises receiving an address from an address counter, transforming the received address to a different address using a random key and providing the transformed address as the address determined by the address counter.

* * * * *